(12) United States Patent
Liu

(10) Patent No.: US 10,939,554 B1
(45) Date of Patent: Mar. 2, 2021

(54) CIRCUIT BOARD ASSEMBLY AND ELECTRONIC DEVICE

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Cheng-Xiang Liu, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/903,649

(22) Filed: Jun. 17, 2020

(30) Foreign Application Priority Data

Apr. 28, 2020 (CN) .......................... 202010351502.4

(51) Int. Cl.
  *H05K 1/18* (2006.01)
  *H01R 12/52* (2011.01)
  *H05K 1/02* (2006.01)

(52) U.S. Cl.
  CPC .............. *H05K 1/181* (2013.01); *H01R 12/52* (2013.01); *H05K 1/0268* (2013.01); *H05K 2201/042* (2013.01); *H05K 2201/10378* (2013.01)

(58) Field of Classification Search
  CPC ...................................................... H05K 1/181
  USPC .......................................................... 361/768
  See application file for complete search history.

(56) References Cited

U.S. PATENT DOCUMENTS

| 2002/0043980 | A1* | 4/2002 | Rincon | G01R 1/07378 324/756.03 |
| 2016/0065334 | A1* | 3/2016 | Warwick | G01R 31/2889 370/249 |
| 2016/0095218 | A1* | 3/2016 | Sakurai | H05K 1/0218 361/768 |
| 2019/0082536 | A1* | 3/2019 | Park | G06F 1/1635 |
| 2019/0137708 | A1* | 5/2019 | Ochi | H01L 25/00 |
| 2020/0335452 | A1* | 10/2020 | Tai | H01L 23/49816 |
| 2020/0336129 | A1* | 10/2020 | Kim | H03H 9/171 |
| 2020/0337188 | A1* | 10/2020 | Yun | H05K 1/144 |

* cited by examiner

*Primary Examiner* — Stanley Tso
(74) *Attorney, Agent, or Firm* — ScienBiziP, P.C.

(57) ABSTRACT

A circuit board assembly allowing a higher population density of electronic components on the board includes a first circuit board, a second circuit board, and an interposer electrically connecting the first circuit board and the second circuit board. The interposer includes a substrate sandwiched between the first circuit board and the second circuit board, the substrate includes a first surface facing the first circuit board, a second surface facing the second circuit board, and a lateral surface connecting the first circuit board and the second circuit board. It is the lateral surface which carries a test pad, allowing all testing of components to be done on the test pad.

12 Claims, 2 Drawing Sheets

CIRCUIT BOARD ASSEMBLY AND ELECTRONIC DEVICE

FIELD

The subject matter herein generally relates to a circuit board assembly and an electronic device using the same.

BACKGROUND

In a circuit board with high integration, increasing numbers of electronic components are installed per unit area. The circuit board can be provided with test pads for testing the standard and solderability of electronic components. The test pad is usually disposed on the front surface or back surface of the circuit board and occupies some of the wiring areas of the circuit board, resulting in a fewer number of electronic components being disposed on the circuit board.

BRIEF DESCRIPTION OF THE DRAWINGS

Implementations of the present technology will now be described, by way of embodiment, with reference to the attached figures.

DETAILED DESCRIPTION

Implementations of the disclosure will now be described, by way of embodiments only, with reference to the drawings. The disclosure is illustrative only, and changes may be made in the detail within the principles of the present disclosure. It will, therefore, be appreciated that the embodiments may be modified within the scope of the claims.

Unless otherwise defined, all technical terms used herein have the same meaning as commonly understood by one of ordinary skill in the art. The technical terms used herein are to provide a thorough understanding of the embodiments described herein, but are not to be considered as limiting the scope of the embodiments.

Figure 1:
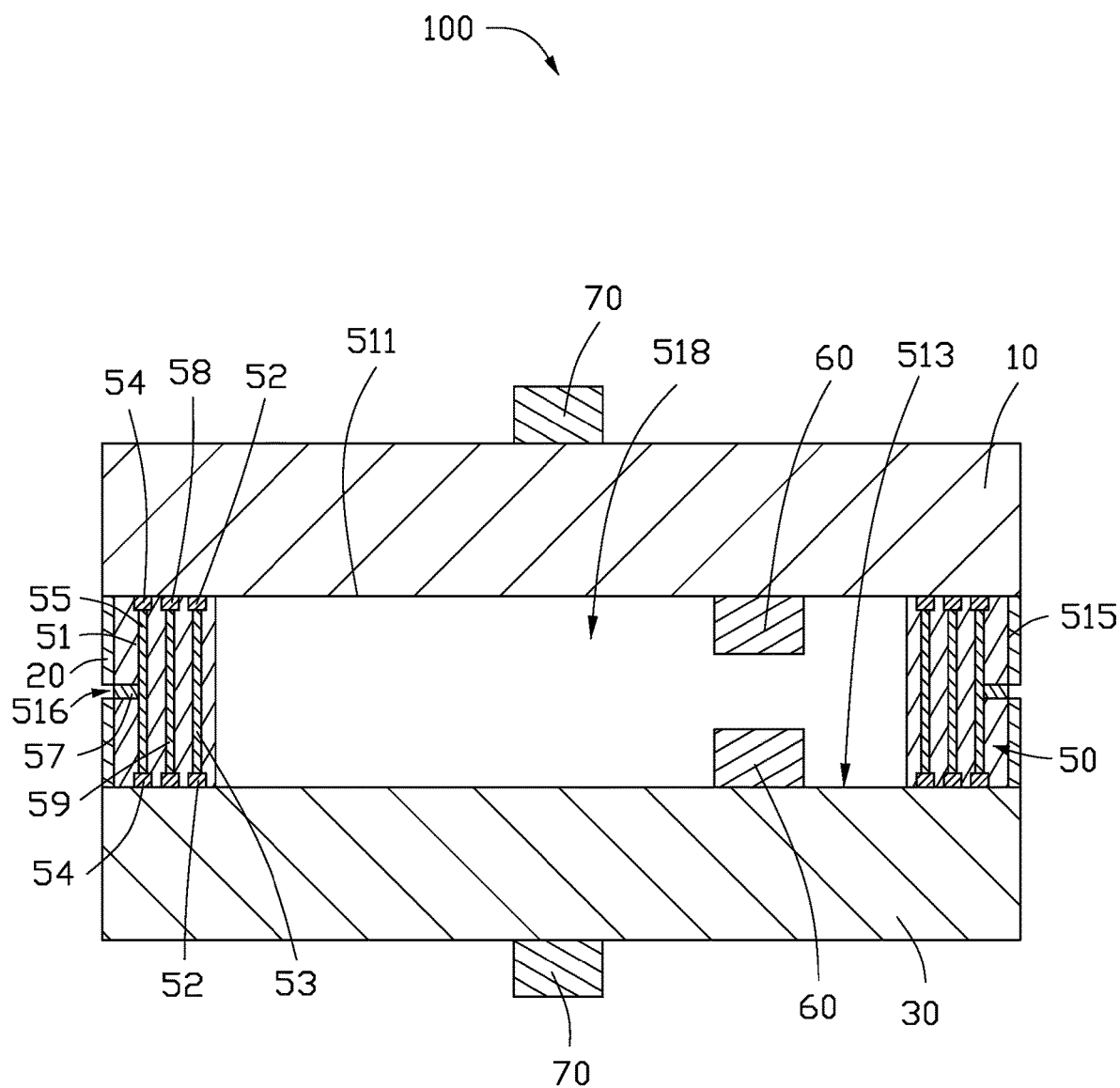
FIG. 1 is a cross-sectional view of a circuit board assembly in one embodiment.
Figure 2:
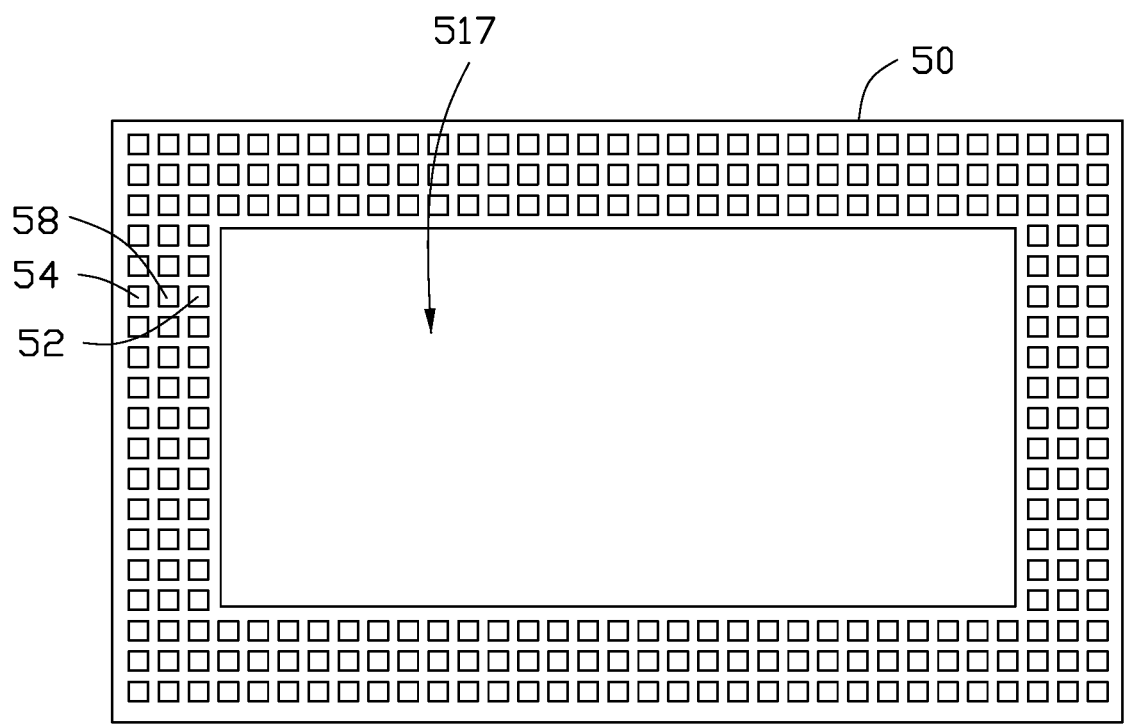
FIG. 2 is a top view of an interposer of the circuit board assembly of FIG. 1.

FIGS. 1 and 2 illustrate a circuit board assembly 100 of an embodiment of the present disclosure. The circuit board assembly 100 includes a first circuit board 10, a second circuit board 30, and an interposer 50. The interposer 50 is sandwiched between the first circuit board 10 and the second circuit board 30. In the embodiment, the first circuit board 10 and the second circuit board 30 are both printed circuit boards.

The interposer 50 includes a substrate 51, a plurality of first solder pads 54, a plurality of first conductive wires 55, a plurality of second solder pads 52, a plurality of second conductive wires 53, and a plurality of test pads 57. The first solder pads 54, the first conductive wires 55, the second solder pads 52, the second conductive wires 53, and the test pads 57 are all disposed on the substrate 51. The first conductive wires 55 are electrically connected to the first solder pads 54, and the test pads 57 are electrically connected to the first conductive wires 55. The second conductive wires 53 are electrically connected to the second solder pads 52.

The substrate 51 is substantially rectangular and includes a first surface 511, a second surface 513 opposite to the first surface 511, and a lateral surface 515 connecting the first surface 511 and the second surface 513. The first surface 511 faces the first circuit board 10 and makes contact with the first circuit board 10. The second surface 513 faces the second circuit board 30 and makes contact with the second circuit board 30. The substrate 51 has a through hole 517 passing through the first surface 511 and the second surface 513. The first circuit board 10 and the second circuit board 30 cover the ends of the through hole 517 to form a receiving chamber 518.

The substrate 51 is made of non-conductive materials, such as polyimide (PI), polyethylene terephthalate (PET), polyethylene naphthalate (PEN), poly ether ether ketone (PEEK), poly tetra fluoro ethylene (PTFE), poly phenylene sulfone resins (PPSU), liquid crystal polymer (LCP), poly phenylene sulfide (PPS), polytetrafluoro ethylene (PFA), or ceramic powder. In the embodiment, the substrate 51 is made of PI.

The first solder pads 54 are arranged into two groups respectively disposed on the first surface 511 and the second surface 513. The first group of first solder pads 54 is disposed on the first surface 511 and electrically connected to the test wirings of the first circuit board 10, and the second group of first solder pads 54 is disposed on the second surface 513 and electrically connected to the test wirings of the second circuit board 30. The first solder pads 54 are embedded into the substrate 51. In an alternative embodiment, the first solder pads 54 may wholly or partly protrude from the first surface 511 or the second surface 513. Each of the two groups of the first solder pads 54 is disposed around the periphery of the substrate 51 to fix the first circuit board 10 and the second circuit board 30 on the substrate 51.

The first conductive wires 55 are embedded into the substrate 51, electrically connected to the first solder pads 54, and allow testing of electronic components on the first circuit board 10 and the second circuit board 30. Specifically, the ends of each first conductive wire 55 are electrically connected to the first group of first solder pads 54 on the first surface 511 and to the second group of first solder pads 54 on the second surface 513. The first conductive wires 55 are made of conductive materials, such as copper, aluminum, silver, gold, copper alloy, or aluminum alloy.

The lateral surface 515 defines a plurality of grooves 516. The first conductive wires 55 are exposed in the grooves 516. The test pads 57 are received in the grooves 516, electrically connected to the first conductive wires 55, and configured for testing the first circuit board 10 and/or the second circuit board 30. The test pads 57 may be formed by filling the grooves 516 with a conductive material.

The second solder pads 52 are arranged into two groups, respectively disposed on the first surface 511 and the second surface 513. The first group of second solder pads 52 is disposed on the first surface 511 and electrically connected to the transmission wirings of the first circuit board 10, and the second group of second solder pads 52 is disposed on the second surface 513 and electrically connected to the transmission wirings of the second circuit board 30. The second solder pads 52 are embedded into the substrate 51. In an alternative embodiment, the second solder pads 52 may wholly or partly protrude from the first surface 511 or the second surface 513. Each group of the second solder pads 52 is disposed around the periphery of the substrate 51 to fix the first circuit board 10 and the second circuit board 30 on the substrate 51. The first solder pads 54 are located outside the second solder pads 52, that is, the first solder pads 54 are closer than the second solder pads 52 to the lateral surface 515 of the substrate 51.

The second conductive wires 53 are embedded into the substrate 51 and electrically connected to the second solder pads 52 to electrically connect the first circuit board 10 and the second circuit board 30. Specifically, the ends of each second conductive wire 53 are electrically connected to the first group of second solder pads 52 on the first surface 511 and to the second group of second solder pads 52 on the second surface 513 respectively. The second conductive wire 53 is made of conductive materials, such as copper, aluminum, silver, gold, copper alloy, or aluminum alloy. The first conductive wires 55 are located outside the second conductive wires 53, that is, the first conductive wires 55 are closer than the second conductive wires 53 to the lateral surface 515 of the substrate 51.

The interposer 50 further includes a plurality of third solder pads 58 and a plurality of third conductive wires 59. The third solder pads 58 are arranged into two groups respectively disposed on the first surface 511 and the second surface 513. The ends of each third conductive wire 59 are electrically connected to the two groups of the third solder pads 58 to ground the first circuit board 10 and the second circuit board 30. The third conductive wires 59 are disposed around the periphery of the substrate 51 and located between the first conductive wires 55 and the second conductive wires 53. In an alternative embodiment, the third conductive wires 59 and the first conductive wires 55 may be arranged in an alternating fashion around the periphery of the substrate 51, or the third conductive wires 59 and the second conductive wires 53 may be arranged around the periphery of the substrate 51 in a similar fashion.

The circuit board assembly 100 further includes a first electronic component 60 and a second electronic component 70. The first electronic component 60 is disposed on a surface of the first circuit board 10 or the second circuit board 30 facing the interposer 50 and is received in the receiving chamber 518. The second electronic component 70 is disposed on a surface of the first circuit board 10 or the second circuit board 30 away from the interposer 50.

The circuit board assembly 100 further includes a shielding layer 20. The shielding layer 20 completely covers the lateral surface 515 of the substrate 51. In the embodiment, the shielding layer 20 is a shield made of a metal, such as gold foil, formed by coating on the lateral surface 515 of the substrate 51. In an alternative embodiment, the shielding layer 20 may be made of other electromagnetic shielding materials.

In one embodiment, an electronic device including the circuit board assembly 100 is provided. The electronic device may be a mobile terminal, such as a mobile phone, a tablet computer, or a wearable device; it may also be other electronic devices, such as a digital camera, an e-book, or a navigator device.

In the circuit board assembly 100, the test pads 57 are disposed on the lateral surface 515 of the substrate 51 of the interposer 50, thereby the test pads 57 do not occupy the wiring areas on the first or second circuit board 10 or 30, thus the first and second circuit boards 10 and 30 may be provided with more electronic components on the surface facing or away from the interposer 50, thereby reducing the size of the circuit board assembly 100.

The test pads 57 being disposed on the lateral surface 515 of the substrate 51 allows all the test wirings on the first circuit board 10 and the second circuit board 30 to lead to the lateral surface 515 of the substrate 51, thereby the test wiring on one circuit board does not need to pass through the interposer 50 to reach other circuit board. This also allows the test wirings to be shortened. In addition, the test pads 57 may have a certain thickness and robustness for longevity, to avoid piercing or other damage by repeated probing of the test pads 57. The direction of thickness of the test pad 57 is perpendicular to that of the circuit board assembly 100, thus an increased thickness of the test pad 57 does not increase the overall thickness of the circuit board assembly 100.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A circuit board assembly comprising:
a first circuit board;
a second circuit board;
an interposer electrically connecting the first circuit board and the second circuit board;
and a shielding layer covering the lateral surface of the substrate;
wherein the interposer comprises a substrate sandwiched between the first circuit board and the second circuit board,
the substrate comprises a first surface facing the first circuit board,
a second surface facing the second circuit board,
and a lateral surface connecting the first circuit board and the second circuit board,
the lateral surface is provided with a test pad;
wherein the interposer comprises at least two first solder pads and a first conductive wire,
the at least two first solder pads are disposed on the first surface and the second surface and are electrically connected to the first circuit board and the second circuit board,
the first conductive wire is embedded into the substrate and is electrically connected to the at least two first solder pads and the test pad;
wherein the substrate defines a groove on the lateral surface,
the first conductive wire is exposed in the groove,
and the test pad is received in the groove and is electrically connected to the first conductive wire.

2. The circuit board assembly of claim 1, wherein the interposer further comprises at least two second solder pads and a second conductive wire, the at least two second solder pads are disposed on the first surface and the second surface and are electrically connected to the first circuit board and the second circuit board, the second conductive wire is embedded into the substrate and is electrically connected to the at least two solder pads to electrically connect the first circuit board and the second circuit board.

3. The circuit board assembly of claim 2, wherein the interposer comprises at least two third solder pads and a third conductive wire, the at least two third solder pads are disposed on the first surface and the second surface of the substrate and are electrically connected to the first circuit board and the second circuit board, the third conductive wire is embedded into the substrate and is electrically connected to the at least two third solder pads to ground the first circuit board and the second circuit board.

4. The circuit board assembly of claim 1, wherein the substrate defines a through hole passing through the first surface and the second surface, the first circuit board and the second circuit board cover the ends of the through hole to form a receiving chamber, the circuit board assembly further comprises a first electronic component, the first electronic component is disposed on at least one of the first circuit board and the second circuit board and is received in the receiving chamber.

5. The circuit board assembly of claim 4, further comprising a second electronic component disposed on at least one side of the first circuit board and the second circuit board away from the receiving chamber.

6. The circuit board assembly of claim 1, wherein each of the first circuit board and the second circuit board is a printed circuit board.

7. An electronic device comprising a circuit board assembly, the circuit board assembly comprising:
 a first circuit board;
 a second circuit board;
 an interposer electrically connecting the first circuit board and the second circuit board;
 and a shielding layer covering the lateral surface of the substrate;
 wherein the interposer comprises a substrate sandwiched between the first circuit board and the second circuit board,
 the substrate comprises a first surface facing the first circuit board,
 a second surface facing the second circuit board,
 and a lateral surface connecting the first circuit board and the second circuit board,
 the lateral surface is provided with a test pad;
 wherein the interposer comprises at least two first solder pads and a first conductive wire,
 the at least two first solder pads are disposed on the first surface and the second surface and are electrically connected to the first circuit board and the second circuit board,
 the first conductive wire is embedded into the substrate and is electrically connected to the at least two first solder pads and the test pad;
 wherein the substrate defines a groove on the lateral surface,
 the first conductive wire is exposed in the groove, and the test pad is received in the groove and is electrically connected to the first conductive wire.

8. The electronic device of claim 7, wherein the interposer further comprises at least two second solder pads and a second conductive wire, the at least two second solder pads are disposed on the first surface and the second surface and are electrically connected to the first circuit board and the second circuit board, the second conductive wire is embedded into the substrate and is electrically connected to the at least two solder pads to electrically connect the first circuit board and the second circuit board.

9. The electronic device of claim 8, wherein the interposer comprises at least two third solder pads and a third conductive wire, the at least two third solder pads are disposed on the first surface and the second surface of the substrate and are electrically connected to the first circuit board and the second circuit board, the third conductive wire is embedded into the substrate and is electrically connected to the at least two third solder pads to ground the first circuit board and the second circuit board.

10. The electronic device of claim 7, wherein the substrate defines a through hole passing through the first surface and the second surface, the first circuit board and the second circuit board cover the ends of the through hole to form a receiving chamber, the circuit board assembly further comprises a first electronic component, the first electronic component is disposed on at least one of the first circuit board and the second circuit board and is received in the receiving chamber.

11. The electronic device of claim 10, wherein the circuit board assembly further comprises a second electronic component disposed on at least one of sides of the first circuit board and the second circuit board away from the receiving chamber.

12. The electronic device of claim 7, wherein each of the first circuit board and the second circuit board is a printed circuit board.

\* \* \* \* \*